(12) United States Patent
Lee et al.

(10) Patent No.: US 7,460,412 B2
(45) Date of Patent: Dec. 2, 2008

(54) FLASH MEMORY DEVICE AND ERASING METHOD THEREOF

(75) Inventors: Doo-Sub Lee, Suwon-si (KR); Jong-In Choi, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 11/617,939

(22) Filed: Dec. 29, 2006

(65) Prior Publication Data

US 2008/0049493 A1 Feb. 28, 2008

(30) Foreign Application Priority Data

Jul. 31, 2006 (KR) .................... 10-2006-0072193

(51) Int. Cl.
*G11C 11/34* (2006.01)
*G11C 16/04* (2006.01)
*G11C 8/00* (2006.01)

(52) U.S. Cl. .................. 365/185.3; 365/185.22; 365/185.23; 365/236; 365/239

(58) Field of Classification Search .............. 365/185.2, 365/185.22, 236, 239, 185.3
See application file for complete search history.

(56) References Cited

U.S. PATENT DOCUMENTS

| 6,529,413 B2 | 3/2003 | Lee et al. |
| 6,560,143 B2 | 5/2003 | Conley et al. |
| 6,724,662 B2 | 4/2004 | Manca |
| 7,142,640 B2 | 11/2006 | Beltz et al. |
| 2001/0010647 A1* | 8/2001 | Roohparvar ........... 365/185.29 |

FOREIGN PATENT DOCUMENTS

| JP | 07-282600 | 10/1995 |
| JP | 08-045284 | 2/1996 |
| JP | 08-255489 | 10/1996 |
| KR | 100257854 | 3/2000 |
| KR | 1020010003410 | 1/2001 |
| KR | 1020010061470 | 7/2001 |
| KR | 1020020047772 | 6/2002 |
| KR | 100449268 | 9/2004 |
| KR | 1020060055698 | 5/2006 |

* cited by examiner

*Primary Examiner*—Ly D Pham
(74) *Attorney, Agent, or Firm*—F. Chau & Assoc., LLC (57) ABSTRACT

A method of post-programming a flash memory device includes the steps of: post-programming memory cells of a selected word line in a predetermined unit; determining, after incrementing an address for selecting the next word line, whether the incremented address matches one of reference addresses; and varying the post-programming unit of the selected memory cells whenever the incremented address matches one of reference addresses.

24 Claims, 6 Drawing Sheets

FLASH MEMORY DEVICE AND ERASING METHOD THEREOF

CROSS-REFERENCE TO RELATED APPLICATION

This U.S. non-provisional patent application claims priority under 35 U.S.C. 517 119 of Korean Patent Application No. 2006-72193 filed on Jun. 7, 2006, the entire contents of which are hereby incorporated by reference.

BACKGROUND

The present disclosure relates to semiconductor memory devices and, more particularly, to flash memory devices.

Flash memory devices as nonvolatile memories are kinds of electrically erasable and programmable read-only memories (EEPROMs) in which plural memory blocks are erased or written with data by one programming operation. A general EEPROM is operable with the feature that one memory block is erasable or programmable at a time. This means that the flash memories operate more rapidly and are effective in reading and writing data when systems employing such flash memory devices read and write data from and into other memory areas at the same time. All kinds of flash memories or EEPROMs are usually configured in a certain structure such that insulation films enclosing charge storage elements used for storing data are inevitably worn out after a specific number of operations.

Flash memories can store information on their silicon chips even without a power supply. More specifically, flash memories are able to retain information without power consumption, even in the interruption of the power supply to the chips. In addition, flash memories offer resistance to physical shocks and fast access times for reading. With those features, the flash memories are widely used as storage units in electronic apparatuses powered by batteries. The flash memories are generally classified in two types, NOR and NAND, in accordance with a logical arrangement of the gates.

In a flash memory device, information is stored in an array of transistors each of which acts as a unit cell storing 1-bit information. On the other hand, there is another kind of flash memory that is advanced in storage capacity, and which is called a multi-level flash memory device that is capable of storing more data bits than a single bit in a unit cell by varying the amount of charges stored in a floating gate of a cell.

A unit cell of the NOR flash memory device is similar to a typical MOSFET in structure, but has two gates. The first one is a control gate that is also included in a general MOSFET, while the second one is a floating gate enclosed by an insulation film. The floating gate is disposed between the control gate and a substrate (or bulk). As the floating gate is isolated from peripheral conductors by the insulation film, electrons are captured in the floating gate to reserve information without leakage. Electrons staying in the floating gate change an electric field from the control gate, partially reducing an effect of the electric field to the substrate, which varies a threshold voltage of the cell. Thus, in reading a data bit from the cell by applying a specific voltage to the control gate, a current may or may not flow through the cell in accordance with the threshold voltage thereof. This operation is regulated by the amount of charges accumulated in the floating gate. Thus, it is able to differentiate data 1 or 0 by detecting whether there is a flow of current through the cell, thereby restoring data stored therein. A multi-level flash memory cell storing more than one bit, detects an amount of current, rather than the presence of current flow, in determining the quantity of electrons accumulated in the floating gate.

A NOR flash memory cell is programmed by applying a program voltage to a control gate, applying a high voltage to a drain, and grounding a source, which sets the cell on a specific data value. With such a bias condition, a large current flows from the drain to the source. This programming scheme is referred to as hot electron injection. In erasing the NOR flash memory cell, a high voltage gap is established between the control gate and the substrate (or bulk), which induces the Fowler-Nordheim (F-N) tunneling effect to release the electrons from the floating gate. A cell array of the NOR flash memory device is usually divided into blocks or sectors each of which forms a segment for erasing. Memory cells belonging to a block are erased at the same time in a single erasing cycle. Otherwise, a programming operation in the NOR flash memory device is carried out in units of bytes or words.

Various ways of erasing data in a NOR flash memory device are proposed in U.S. Pat. No. 5,781,477 entitled "FLASH MEMORY SYSTEM HAVING FAST ERASE OPERATION", U.S. Pat. No. 5,132,935 entitled "ERASURE OF EEPROM MEMORY ARRAYS TO PREVENT OVER-ERASED-CELLS", U.S. Pat. No. 5,220,533 entitled "METHOD AND APPARATUS FOR PREVENTING OVERERASURE IN A FLASH CELL", U.S. Pat. No. 5,513,193 entitled "NON-VOLATILE SEMICONDUCTOR MEMORY DEVICE CAPABLE OF CHECKING THE THRESHOLD VALUE OF MEMORY CELLS", and U.S. Pat. No. 5,805,501 entitled "FLASH MEMORY DEVICE WITH MULTIPLE CHECKPOINT ERASE SUSPEND LOGIC", all of which are incorporated by reference in this application.

Figure 1:
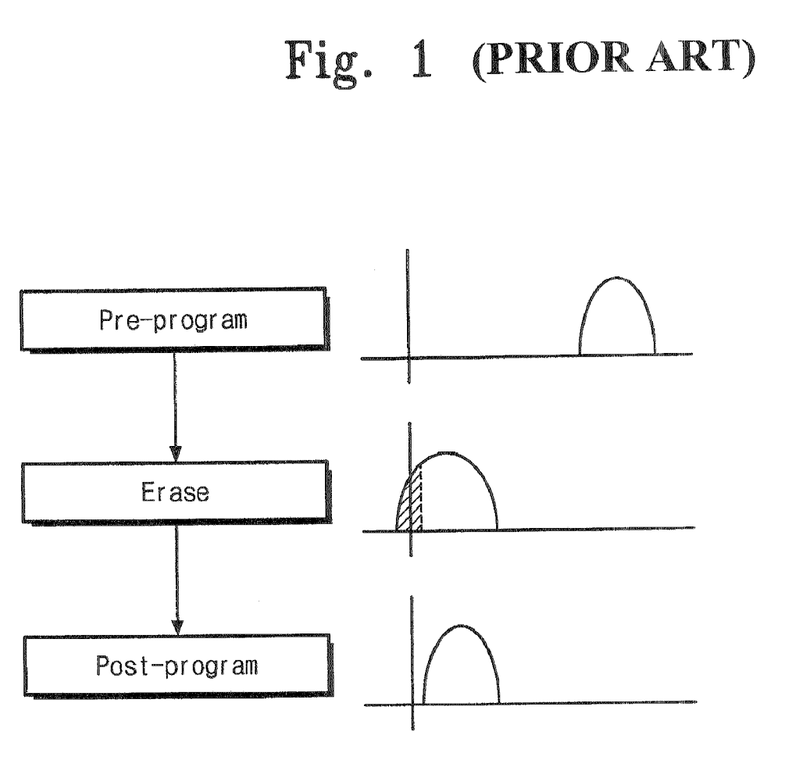
FIG. 1 is a schematic showing a procedure of erasing data in a general flash memory device.

All memory cells included in a selected sector of a NOR memory device, as shown in FIG. 1, are erased in the sequence of pre-programming, erasing, and post-programming (or over-erasure curing) operations. During the pre-programming operation, the memory cells are programmed in the condition that; sources and bulk are supplied with predetermined voltages, for example, 0V and −1V, respectively; control gates are supplied with a high voltage, for example, a step voltage 2~8V; and drains are supplied with a positive voltage, for example, 4.2V, to induce hot electrons. According to this bias condition, a sufficient amount of negative charges are accumulated in floating gates of the memory cells, making the floating gates charged with negative potential. This programmed memory cell is referred to as "off-cell". The programmed memory cells have threshold voltages located in the territory of target threshold voltages corresponding to off-cells.

The pre-programmed memory cells are erased by means of the F-N tunneling scheme. According to the F-N tunneling scheme, a negative voltage, for example, −9V, is applied to the control gates of the cells and a voltage sufficient to cause the effect of F-N tunneling is applied to a semiconductor substrate of the device. During this time, the sources and drains are maintained in floating states. This erasing scheme is referred to as the negative gated bulk erase (NGBE) mode. During the NGBE mode, a strong electric field of about 6~7 MV/cm is formed between the control gate and the semiconductor substrate, inducing the F-N tunneling effect. As a result of the NGBE mode, negative charges accumulated in the floating gate are discharged into the bulk, that is, into the semiconductor substrate, through an insulation film of about 100 Å thickness. An EEPROM cell erased in this manner is referred to as an "on-cell". Erased memory cells have threshold voltages located in the territory of the target threshold voltages corresponding to on-cells.

After conducting the NGBE mode, it is checked whether the erased memory cells are located in the range of target threshold voltages in correspondence with the on-cells. In general, there are memory cells having threshold voltages lower than the minimum value of the target threshold voltages range, even after all memory cells have been erased at the same time. A memory cell with such a lower threshold voltage is referred to as an "over-erased memory cell". These over-erased memory cells may be cured by means of the post-programming (over-erased curing or erasure repairing) operation. As a result, threshold voltages of the over-erased memory cells can be distributed within the territory of target threshold voltages in correspondence with the on-cells.

The post-programming operation is carried out by grounding the sources of the over-erased memory cells, applying a negative voltage, for example, −1V, to the semiconductor substrate, applying a predetermined voltage, for example, 1.6V, to the control gates, and applying a predetermined voltage, for example, 4.2V, to the drains, for a predetermined time. Under this bias condition, negative charges less than those of the pre-programming operation may be accumulated in the floating gate. Therefore, the post-programming operation forces the threshold voltages of the over-erased memory cells to move into the territory of target threshold voltages.

Figure 2:
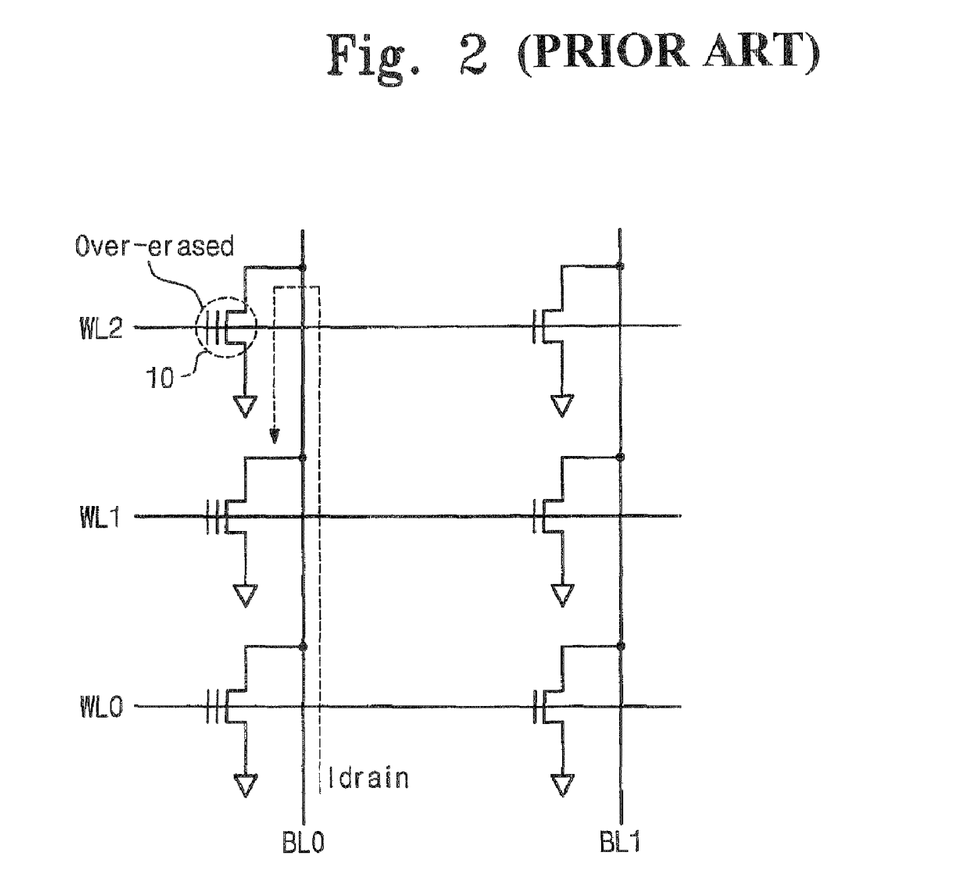
FIG. 2 is a circuit diagram showing a pattern of leakage current arising from an over-erased memory cell during a post-programming mode.

A drain current supplied to a bit line during the post-programming operation, as illustrated in FIG. 2, may leak out through an over-erased memory cell, shown at 10. An amount of current leaking out may be proportional to the number of over-erased memory cells connected with the bit line corresponding thereto. If an amount of leakage current increases, the post-programming operation for selected memory cells may not be carried out in a normal condition. Because of that, it is inevitable to restrict the number of memory cells to be programmed in a time during the post-programming operation. By the restrictive number of memory cells that can be programmed at a time, it may take a long time in conducting the post-programming operation, resulting in an increase in the whole erasing time of the flash memory device.

Therefore, there is a requirement for a new scheme to shorten the time for conducting the post-programming operation.

SUMMARY OF THE INVENTION

Exemplary embodiments of the present invention are directed to provide a flash memory device capable of shortening the whole erasing time and to provide a post-programming method thereof.

Furthermore, exemplary embodiments of the present invention are directed to provide a flash memory device and to provide a method capable of shortening the time for conducting a post-programming operation.

Exemplary embodiments of the present invention are also directed to provide a flash memory device capable of controlling the number of memory cells to be programmed at a time during a post-programming operation and a method thereof.

An exemplary embodiment of the present invention is a method of post-programming a flash memory device. The method comprises the steps of: (a) post-programming memory cells of a selected word line in a predetermined unit; (b) determining, after incrementing an address for selecting the next word line, whether the incremented address matches with one of reference addresses; and (c) varying the post-programming unit of the selected memory cells whenever the incremented address matches with one of the reference addresses.

In an exemplary embodiment, the post-programming unit of the selected memory cells is incremented whenever the incremented address matches with one of the reference addresses.

In an exemplary embodiment, the post-programming unit of the selected memory cells is changed by controlling the number of write drivers activated at the same time.

In an exemplary embodiment, the steps of (a) through (c) set forth above are repeated until all word lines are selected.

In an exemplary embodiment, reference addresses are stored in a register of the flash memory device.

In an exemplary embodiment, the reference addresses are externally provided to the register before a normal operation.

In an exemplary embodiment, the reference addresses are provided to the register from an array of the flash memory device before a normal operation.

Furthermore, exemplary embodiments of the present invention provide a method of post-programming a flash memory device, comprising the steps of: (a) selecting a word line in response to an address; (b) post-programming memory cells of the selected word line in a predetermined unit; (c) determining, after incrementing the address, whether the incremented address matches with one of the reference addresses; (d) varying the post-programming unit of the selected memory cells whenever the incremented address matches with one of the reference addresses; and (e) repeating the steps (a) through (d) until all word lines are selected.

In an exemplary embodiment, the post-programming unit of the selected memory cells is incremented whenever the incremented address matches with one of the reference addresses.

In an exemplary embodiment, the post-programming unit of the selected memory cells is changed by controlling the number of write drivers activated at the same time.

In an exemplary embodiment of the present invention, a flash memory device having a memory cell array with memory cells arranged in rows and columns comprises: a row decoder selecting the rows in response to a row address; a column decoder selecting the columns in response to a column address, write drivers divided into plural groups, driving the selected columns with a bit line voltage; a column address generator counting the number of post-programming operations and generating the column address and a count-up pulse signal; a row address generator configured to store reference addresses, generating the row address in response to the count-up pulse signal; and a selection circuit generating selection signals to activate the write driver groups in response to the counted value. The row address generator outputs flag information indicating a change of column selection unit whenever the row address matches one of the reference addresses. The selection circuit controls activation of the selection signals in accordance with the flag information so as to increase the number of memory cells to be post-programmed in the selected columns.

In an exemplary embodiment, the column address generator outputs the count-up pulse signal when memory cells of the selected row are all post-programmed.

In an exemplary embodiment, the write drivers of each group, when a corresponding selection signal is activated, are set in a program value to drive corresponding bit lines with a bit line voltage.

In an exemplary embodiment, the row address generator comprises a register for storing the reference addresses.

In an exemplary embodiment, the reference addresses are externally provided to the register before a normal operation.

In an exemplary embodiment, the reference addresses are provided to the register from the memory cell array before a normal operation or at a power-up time.

In an exemplary embodiment, the flag information informs that the columns are selected in the column selection unit selected from ×4, ×8, and ×16.

In an exemplary embodiment, when the flag information informs that the columns are selected in the unit of ×4, the selection circuit activates the selection signals in sequence in response to the counted value.

In an exemplary embodiment, when the flag information informs that the columns are selected in the unit of ×8, the selection circuit activates pairs of the selection signals in sequence in response to the counted value.

In an exemplary embodiment, when the flag information informs that the columns are selected in the unit of ×16, the selection circuit activates the selection signals at the same time in response to the counted value.

In an exemplary embodiment, the column address generator comprises: a 2-bit counter conducting a counting operation in accordance with the transition of a program execution signal instructing the post-programming operation and outputting a pulse signal whenever a carry is generated; and an N-bit counter generating the column address from a counting operation in accordance with the poise signal and generating the count-up pulse signal when the columns are all selected.

In an exemplary embodiment, the 2-bit counter is configured to vary a point of generating the carry in accordance with the flag information.

In an exemplary embodiment, the post-programming operation includes a verifying operation.

In an exemplary embodiment, the post-programming operation is carried out without including a verifying operation.

A further understanding of the nature and advantages of the exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the attached drawings. In the figures.

DETAILED DESCRIPTION OF EXEMPLARY EMBODIMENTS

Exemplary embodiments of the present invention will be described below in more detail with reference to the accompanying drawings, showing a flash memory device as an exemplary embodiment for illustrating structural and operational features. The present invention may, however, be embodied in different forms and should not be construed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout the accompanying figures.

Figure 3:
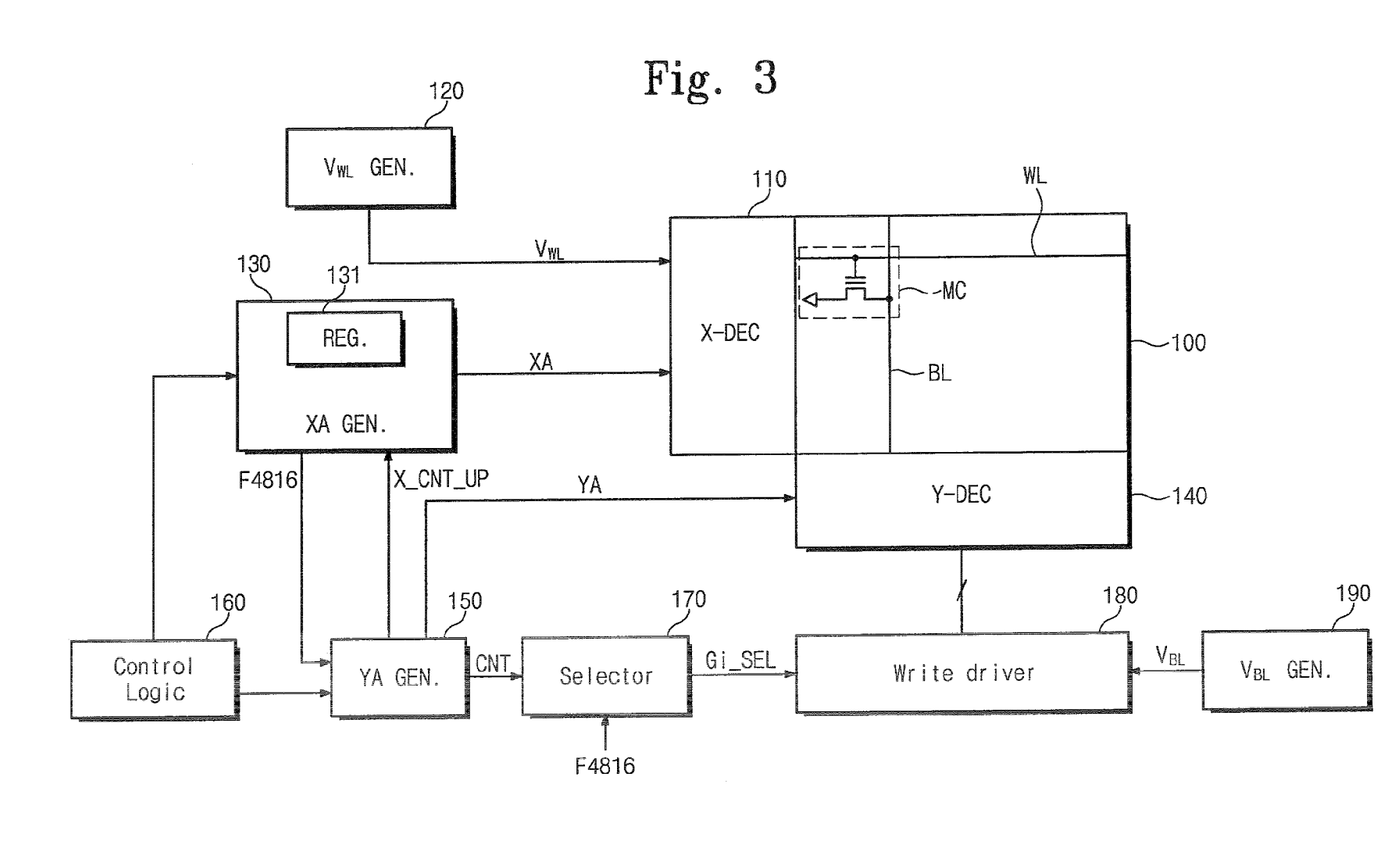
FIG. 3 is a block diagram illustrating a flash memory device in accordance with an exemplary embodiment of the present invention.

FIG. 3 is a block diagram illustrating a flash memory device in accordance with an exemplary embodiment of the present invention. This flash memory device is a NOR flash memory device for example. But, it should be understood that the present Invention is also applicable to other kinds of memory devices, for example, magnetic ROM, phase-changeable ROM, ferroelectric RAM, NAND flash memory device, and so on.

Referring to FIG. 3, the flash memory device according to an exemplary embodiment of the present invention has a memory cell array 100 composed of memory cells MC arranged at intersections of rows (or word lines) and columns (or bit lines). Each memory cell may be formed including a floating gate transistor, but the present invention is not restricted to a particular structural pattern of the memory cell. A row decoder 110 may select rows of the memory cell array 100 in response to row addresses XA provided from a row address generator 130. The row decoder 110 drives a selected row with a word line voltage $V_{WL}$ supplied from a word line voltage generator 120. The word line voltage generator 120 may be configured to generate the word line voltage $V_{WL}$ to be supplied into the selected row in accordance with an operation mode. A column decoder 140 may select columns (or bit lines) of the memory cell array 100 in response to column addresses YA provided from a column address generator 150. During programming/erasing operations, the column decoder 140 may select columns (or bit lines) of the memory cell array 100 in a predetermined unit, for example, ×8, ×16, ×32, and so on.

As shown in FIG. 3, a control logic block 160 may be configured to control an overall operation of the flash memory device. The column address generator 150 is regulated by the control logic block 160 during a post-programming operation, and generates the column addresses YA in response to flag information (for example, F4816) provided from the row address generator 130. For instance, during the post-programming operation, the column address generator 150 may be configured to sequentially generate the column addresses YA on the basis of the flag information F4816 until all bit lines of a row designated by the flag information F4816 are selected. If all of the bit lines of the designated row are fully selected, the column address generator 150 outputs a count-up pulse signal X_CNT_UP. The column address generator 150 is configured to count the number of program cycles under regulation of the control logic block 160. Counted values CNT from the column address generator 150 are provided to a selection circuit 170.

The row address generator 130 is configured to generate the row addresses XA in response to the count-up pulse signal X_CNT_UP output from the column address generator 150 during the post-programming operation. Namely, the row address generator 130 increases a row address by a predetermined value (for example, '1') when the count-up pulse signal X_CNT_UP is generated from the column address generator 150. The row address generator 130 includes a register 131 formed to store address information. The address information stored in the register 131 may contain row address information (or reference address information) to select at least two rows from among the rows of the memory cell array 100. But, the address information to be stored in the register 131 may also include information to select a larger number of rows, that is, more than the two rows. Row addresses stored in the register 131 may be ranked continuously or discontinuously to each other. For example, assuming that the memory cell array 100 includes 512 rows, row addresses to select the 255'th and the 388'th rows may be stored in the register 131. The register 131 may be implemented by means of nonvolatile memory elements (for example, fuses, transistors, and so on) or volatile memory elements (for example, latches). When the register 131 is formed of volatile memory elements (for example, latches), it may store externally provided address information at the time of power-up, or address information read out from the memory cell array 100. The row address generator 130 may be configured, during the post-programming operation, to generate the flag information F4816 whenever a current address XA matches with an address stored in the register 131. The flag information F4816 corresponds to information that means a set of columns or bit lines is selected from ×4, ×8, and ×16, which will be described in detail hereinbelow.

Figure 4:
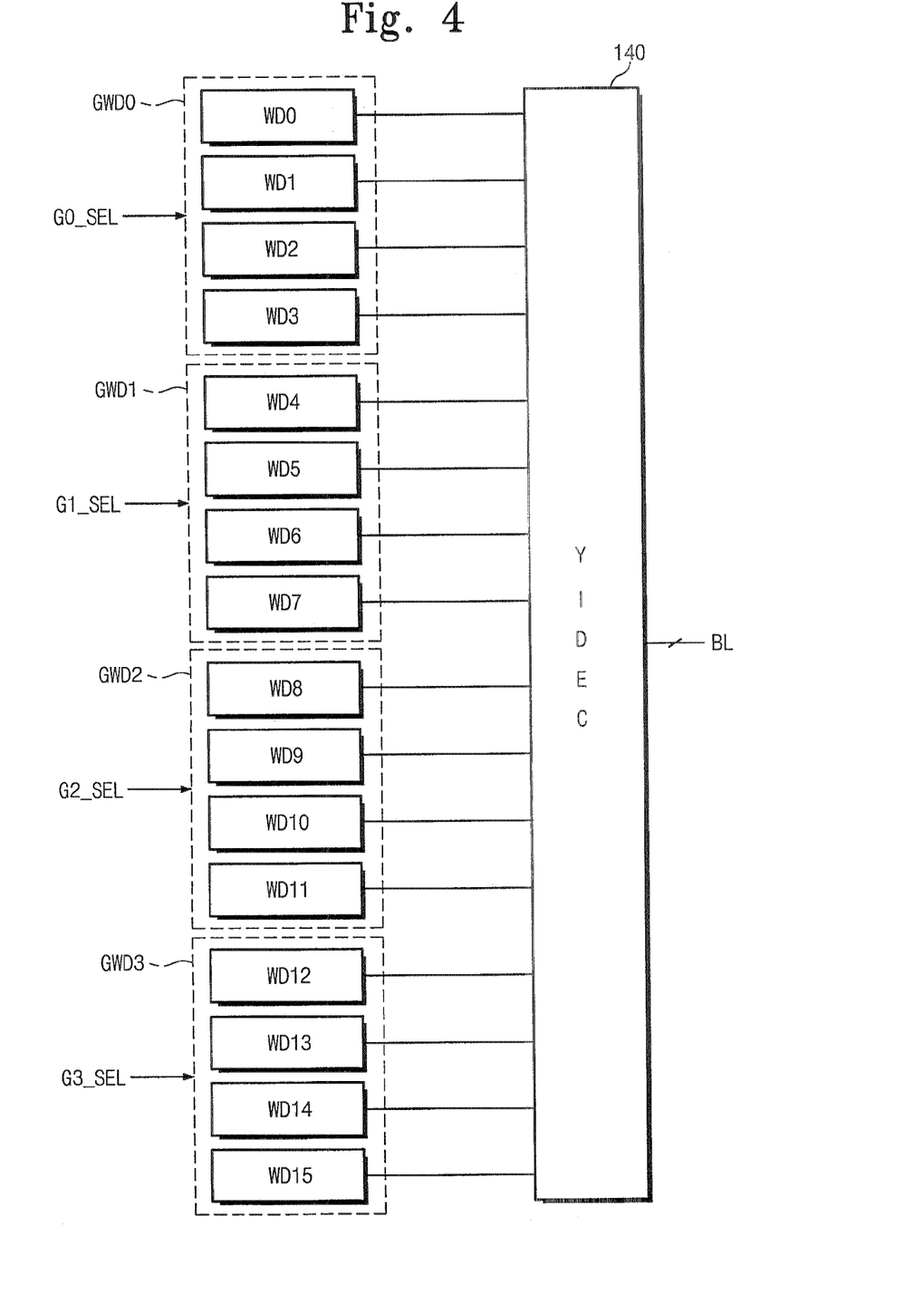
FIG. 4 is a block diagram schematically illustrating the write driver shown in FIG. 3.

Also in FIG. 3, the selection circuit 170 generates selection signals Gi_SEL (i=0~3) in response to the flag information F4816 output from the row address generator 130 and the counted value CNT of program cycle number output from the column address generator 150. For instance, when the flag information F4816 indicates that a set of columns/bit lines is selected in ×4, the selection circuit 170 sequentially activates the selection signals Gi_SEL in accordance with the counted value CNT. When the flag information F4816 indicates that a set of columns/bit lines is selected in ×8, the selection circuit 170 sequentially activates pairs of the selection signals Gi_SEL in accordance with the counted value CNT. When the flag information F4816 indicates that a set of columns/bit lines is selected in ×16, the selection circuit 170 activates all the selection signals Gi_SEL at the same time in accordance with the counted value CNT. A write driver circuit 180 operates in response to the selection signal Gi_SEL, driving bit lines, which are selected by the column decoder 140, with a bit line voltage $V_{BL}$ provided from a bit line voltage generator 190. The write driver circuit 180 is composed of plural write drivers, for example, 16 write drivers WD0~WD15. As illustrated in FIG. 4, the write drivers WD0~WD15 are divided into four groups GWD0~GWD3. The write driver groups GWD0~GWD3 are each controlled by their corresponding selection signals G0_SEL~G3_SEL. For instance, when one of the selection signals Gi_SEL (i=0~3) is activated, the four write drivers belonging to one of the four groups GWD0~GWD3 is enabled. This means that four memory cells are post-programmed at the same time.

In this exemplary embodiment, the flag information F4816 is used as a signal to inform of alternation of column selection unit or set.

As can be seen from the above, an increase of the number of selected rows causes an increase of the number of the write drivers selected in a time. This means an increase of the number of memory cells to be post-programmed at the same time. As the number of write drivers increases, it is possible to shorten a time for conducting the post-programming operation in the flash memory device.

Figure 5:
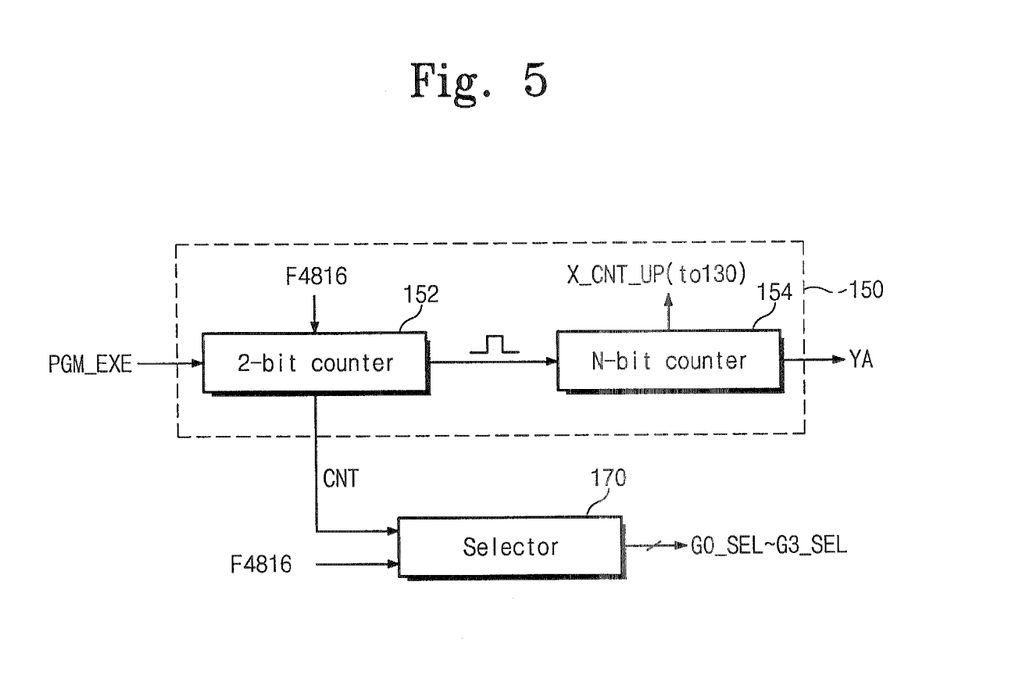
FIG. 5 is a block diagram schematically illustrating the column address generator shown in FIG. 3.

FIG. 5 is a block diagram schematically illustrating the column address generator shown in FIG. 3.

Referring to FIG. 5, the column address generator 150 according to an exemplary embodiment of the present invention is comprised of a 2-bit counter 152 and an N-bit counter 154. The 2-bit counter 152 conducts a counting operation in response to a program execution signal PGM_EXE output from the control logic block 160 of FIG. 3. The counting operation is controlled by the flag information G4816. For instance, when the flag information F4816 indicates that a set of columns/bit lines is selected in ×4, the counted value CNT of the 2-bit counter 152 is sequentially incremented in the order of '00', '01', '10', and '11' in sync with transition of the program execution signal PGM_EXE. When the flag information F4816 indicates that a set of columns/bit lines is selected in ×8, the counted value CNT of the 2-bit counter 152 is sequentially incremented in the order of '0x' and '1x' (x: don't care) in sync with transition of the program execution signal PGM_EXE. Namely, only the higher bit is changed. As also, the 2-bit counter 152 outputs a pulse whenever there is generated a carry. When the flag information F4816 indicates that a set of columns/bit lines is selected in ×16, the 2-bit counter 152 outputs a pulse whenever the program execution signal PGM_EXE is activated (or whenever a carry is generated therein).

Referring again to FIG. 5, the N-bit counter 154 performs a counting operation in response to an output of the 2-bit counter 152 and generates the column addresses YA as a result of the counting. The column addresses YA are provided to the column decoder 140 to sequentially select columns in a predetermined unit or set (for example, ×16). After generating the column addresses YA to select columns of the last set, the N-bit counter 154 generates the count-up pulse X_CNT_UP to the row address generator 130 of FIG. 3. Namely, the N-bit counter 154 generates the count-up pulse signal X_CNT_UP whenever all bit lines of a selected row are fully selected. This means the next row will be selected.

The selection circuit 170 generates the selection signals Gi_SEL (i=0~3) in response to the counted value CNT of the 2-bit counter 152 and the flag information F4816. When the flag information F4816 indicates that a set of columns/bit lines is selected in ×4, the selection circuit 170 activates one of the selection signals Gi_SEL (i=0, 1, 2, or 3) in accordance with the counted value CNT. For example, when the counter value CNT is '00', the selection circuit 170 activates the selection signal G0_SEL to enable the write driver group GWD0. The write drivers WD0~WD3 of the write driver group GWD0 are set in a program value (for example, '1') by the selection signal G0_SEL. At the same time, the write drivers WD4~WD15 of the rest of the groups GWD1~GWD3 are set in a program-inhibit value (for example, '0') by the inactive selection signals G1_SEL~G3_SEL. When the counter value CNT is '01', the selection circuit 170 activates the selection signal G1_SEL to enable the write driver group GWD1. The write drivers WD4~WD7 of the write driver group GWD1 are set in a program value (for example, '1') by the selection signal G1_SEL. At the same time, the write drivers WD0~WD3 and WD8~WD15 of the rest of the groups GWD0, GWD2, and GWD3 are set in a program-inhibit value (for example, '0') by the inactive selection signals G0_SEL, G2_SEL, and G3_SEL. Along with increments of the counted value CNT, the rest of the write driver groups will be selected in the same manner as described above. Thus, when the flag information G4816 informs that columns/bit lines are selected in the unit or set of ×4, four memory cells are simultaneously post-programmed.

When the flag information F4816 indicates that a set of columns/bit lines is selected in ×8, the selection circuit 170 partially activates the selection signals Gi_SEL at the same time in accordance with the counted value CNT. For example, when the counter value CNT is '0x', the selection circuit 170 activates the selection signals G0_SEL and G1_SEL, at the same time, to enable the write driver groups GWD0 and GWD1. The write drivers WD0~WD7 of the write driver groups GWD0 and GWD1 are set in a program value (for example, '1') by the selection signals G0_SEL and G1_SEL. At the same time, the write drivers WD8~WD15 of the rest of the groups GWD2 and GWD3 are set in a program-inhibit value (for example, '0') by the inactive selection signals G1_SEL~G3_SEL. When the counter value CNT is '1x', the selection circuit 170 activates the selection signals G2_SEL and G3_SEL, at the same time, to enable the write driver groups GWD2 and GWD3. The write drivers WD8~WD15 of the write driver groups GWD2 and GWD3 are set in a program value (for example, '1') by the selection signals G2_SEL and G3_SEL. At the same time, the write drivers WD0~WD7 of the rest of the groups GWD0 and GWD1 are set in a program-inhibit value (for example, '0') by the inactive selection signals G0_SEL~G1_SEL. Thus, when the flag information G4816 informs that, columns/bit lines are selected in the unit, or set of ×8, eight memory cells are simultaneously post-programmed.

As the last case, when the flag information F4816 indicates that a set of columns/bit lines is selected in ×16, the selection circuit 170 activates the selection signals Gi_SEL at the same time every activation of the program execution signal PGM_EXE. In other words, the selection circuit 170 activates the selection signals G0_SEL~G3_SEL at the same time whenever the 2-bit counter 152 generates a carry or a pulse. This means that the write drivers WD0~WD15 are all set in a program value (for example, '1'). Thus, when the flag information G4816 informs that columns/bit lines are selected in the unit or set of ×16, 16 memory cells are simultaneously post-programmed.

Figure 6:
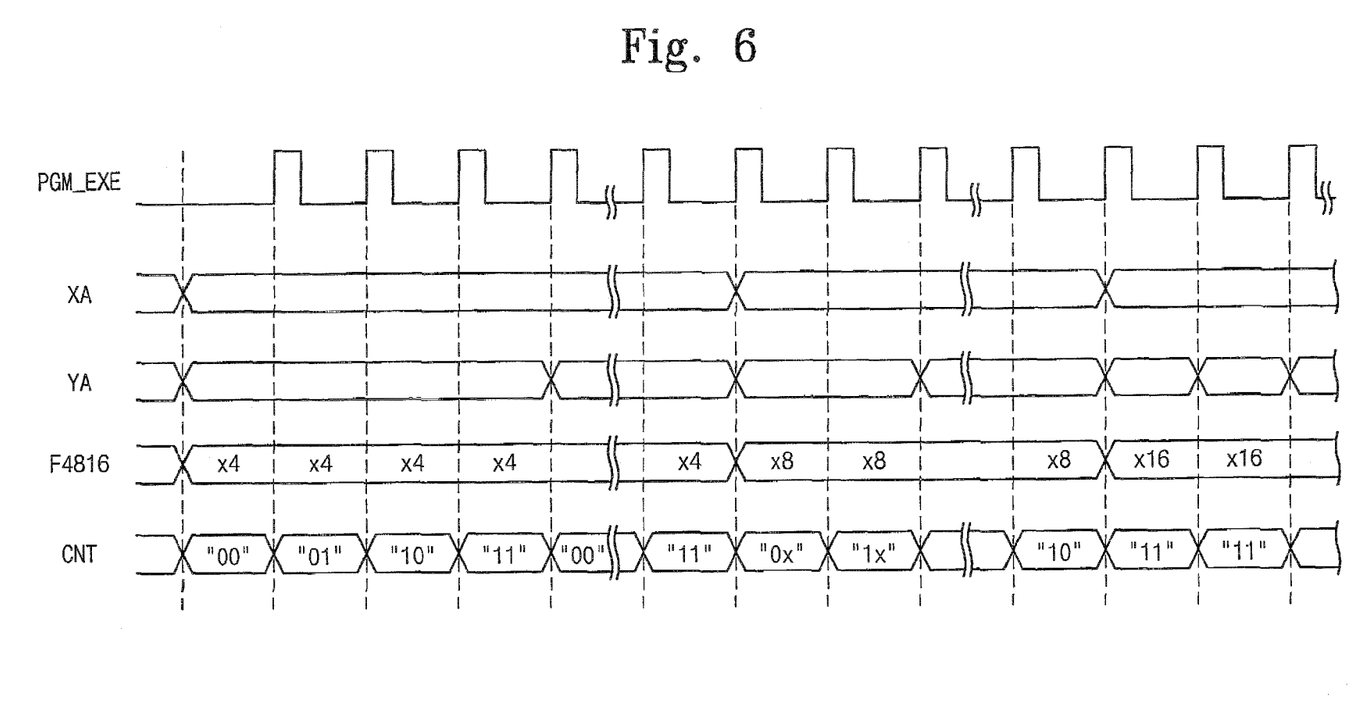
FIG. 6 is a timing diagram showing a post-programming operation of the flash memory device according to an exemplary embodiment of the present invention.

FIG. 6 is a timing diagram showing the post-programming operation of the flash memory device according to an exemplary embodiment of the present invention Now, hereinafter the post-programming operation in the flash memory device according to an exemplary embodiment of the invention will be described in detail, with reference to accompanying figures.

As described above, memory cells of the memory cell array 100 are erased in the sequence of the pre-programming, erasing, and post-programming operations. The pre-programming and erasing operations are well known by those skilled in the art, so they will not be described in detail. Prior to the explanation of the post-programming operation, it is assumed that the memory cell array 100 is comprised of 512 word lines/rows WL0~WL511 and 2048 bit lines/columns BL0~BL2047; the register 131 of the row address generator 130 stores row addresses to select the 255'th and 383'th word lines; and the column decoder 140 selects the columns in the unit or set of ×16. It will be understood that this assumption about the configuration is just an example, and the present invention is not limited thereto.

At the beginning of the post-programming operation, the row and column address generators, 130 and 150, are first initialized under regulation of the control logic block 160. This means that the row and column addresses, XA and YA, are set to '0'. Then, in the row decoder 110 a row/word line WL0 in response to the row address XA and the column decoder 140 selects 16 bit lines in response to the column address YA. The row decoder 110 drives the selected word line with the word line voltage $V_{WL}$ generated from the word line voltage generator 120. According to generation of the row address XA to select a first word line, the row address generator 130 outputs the flag information F4816. Then, the selection circuit 170 activates the selection signal G0_SEL in response to the counted value CNT:00 of the 2-bit counter 152, which activates the write driver group GWD0 and inactivates the other write driver groups GWD1~GWD3. As stated above, the write driver group GWD0 is set in the program value (for example, '1') by activation of the selection signal G0_SEL while the rest of the write driver groups GWD1~GWD3 are set in the program-inhibit value (e.g., '0') by inactivation of the selection signals G1_SEL~G3_SEL.

The write drivers WD0~WD3 set in the program value drive their corresponding bit lines (for example, BL0~BL3) with the bit line voltage $V_{BL}$ provided from the bit line voltage generator 190. Otherwise, the write drivers WD4~WD5 set in the program-inhibit value drive their corresponding bit lines (for example, BL4~BL15) with a ground voltage. While 16 bit lines are selected by the column decoder 140, only four bit lines are driven in the bit line voltage $V_{BL}$ by their write drivers corresponding to the activated selection signal. Under this bias condition for a predetermined time, memory cells coupled to the bit lines driven with the bit line voltage $V_{BL}$ are post-programmed.

In the flash memory device of the present invention, it is permissible to omit a verifying operation for the post-programmed memory cells. But, it will be apparent to those skilled in the art that it is also possible to conduct the verifying operation for the post-programmed memory cells. Although not shown in the accompanying drawings, a sense amplifier circuit may be provided to sense data from the post-programmed memory cells in the flash memory device. According to data detected by the sense amplifier circuit (not shown), the control logic block 160 conducts an additional post-programming operation for previously programmed memory cells or a post-programming operation for the next memory cells. The verifying operation is well known in this technical field, so it will not be described further.

After a predetermined time under the aforementioned bias condition, as illustrated in FIG. 6, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '00' to '01'. During this time, as there is no carry, as shown in FIG. 6, the output YA of the N-bit counter 154 does not change. Further, as there is no generation of the count-up pulse signal X_CNT_UP, the row address XA does not change either.

According to the change of the counted value CNT to '01', the selection circuit 170 activates the selection signal G1_SEL. Thus, the next write driver group GWD1 is enabled for operation. As described above, only four bit lines among the 16 bit lines selected by the column decoder 140 are driven with the bit line voltage $V_{BL}$ by the activated write drivers. Under this bias condition for a predetermined time, memory cells coupled to the bit lines driven with the bit line voltage $V_{BL}$ are post-programmed. After a predetermined time under the aforementioned bias condition, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '01' to '10'. During this, as there is no carry, as shown in FIG. 6, the output YA of the N-bit counter 154 does not change. Further, as there is no generation of the count-up pulse signal X_CNT_UP, the row address XA also does not change.

According to the change of the counted value CNT to '10', the selection circuit 170 activates the selection signal G2_SEL. Thus, the next write driver group GWD2 is enabled for operation. As aforementioned, only four bit lines among the 16 bit lines selected by the column decoder 140 are driven with the bit line voltage $V_{BL}$ by the activated write drivers. Under this bias condition for a predetermined time, memory cells coupled to the bit lines driven with the bit line voltage $V_{BL}$ are post-programmed. After a predetermined time under the aforementioned bias condition, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '10' to '11'. During this time, as there is no carry, as shown in FIG. 6, the output YA of the N-bit counter 154 does not change. Further, as there is no generation of the count-up pulse signal X_CNT_UP, the row address XA also does not change.

According to the change of the counted value CNT to '11', the selection circuit 170 activates the selection signal G3_SEL. Thus, the next write driver group GWD3 is enabled for operation. As aforementioned, only four bit lines among the 16 bit lines selected by the column decoder 140 are driven with the bit line voltage $V_{BL}$ by the activated write drivers. Under this bias condition for a predetermined time, memory cells coupled to the bit lines driven with the bit line voltage $V_{BL}$ are post-programmed After a predetermined time under the aforementioned bias condition, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '11' to '00'. During this, as a carry is generated, as shown in FIG, 6, the output YA of the N-bit counter 154 is counted up to select the next bit line group (that is, 16 bit lines). The 16 bit lines are selected by the counted-up column address YA. The selected bit lines are driven in the same manner with the aforementioned. Namely, the bit lines are driven with the bit line voltage $V_{BL}$ in the unit of ×4.

If the memory cells coupled to the selected row WL0 are all post-programmed by way of the aforementioned scheme, or when there is generated a carry from the N-bit counter 154, the count-up pulse signal X_CNT_P is generated to increment the row address XA by '1'. The row decoder 110 selects the next row/word line WL1 in response to the incremented row address XA. After that, memory cells coupled to the selected row WL1 are post-programmed in the same manner described above, so it will not be described further.

If the incremented row address XA matches with a row address (for example, a row address of the 256'th word line) stored in the register 131 of the row address generator 130, the row address generator 130 outputs the flag information G4816 informing that columns are selected in the unit or set of ×8.

As the flag information F4816 indicates that columns are selected in the unit of ×8, the 2-bit counter 152 increments the higher bit by '1' in response to transition of the program execution signal PGM_EXE. The selection circuit 170 partially activates the selection signals Gi_SEL at the same time in accordance with the counted value CNT. For example, when the counter value CNT of the 2-bit counter 152 is '0x', the selection circuit 170 activates the selection signals G0_SEL and G1_SEL at the same time. This means that eight bit lines of the selected bit lines are driven with the bit line voltage $V_{BL}$ at the same time. After post-programming the memory cells coupled to the bit lines driven with the bit line voltage $V_{BL}$, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '0x' to '1x'. During this time, because there is no carry from the 2-bit counter 152, as shown in FIG. 6, the output YA of the N-bit counter 154 does not change. Further, as there is no generation of the count-up pulse signal X_CNT_UP, the row address XA also does not change.

According to the change of the counted value CNT to '1x', the selection circuit 170 activates the selection signals G2_SEL and G3_SEL at the same time. This means that eight bit lines among the selected bit lines are driven with the bit line voltage $V_{BL}$ at the same time. After post-programming the memory cells coupled to the bit lines driven with the bit line voltage $V_{BL}$, the control logic block 160 activates the program execution signal PGM_EXE. The 2-bit counter 152 of the column address generator 150 begins its count-up operation in response to activation (low-to-high or high-to-low) of the program execution signal PGM_EXE, changing the counted value CNT from '1x' to '0x'. During this time, as a carry is generated from the 2-bit counter 152, as shown in FIG. 6, the output YA of the N-bit counter 154 is counted up to select the next bit Sine group (that is, 16 bit lines). The 16 bit lines are selected by the counted-up column address YA. The selected bit lines are driven in the same manner described above. Namely, the bit lines are driven with the bit line voltage $V_{BL}$ in the unit of ×8.

If the memory cells coupled to the selected row are all post-programmed by way of the above-described scheme, or when there is generated a carry from the N-bit counter 154, the count-up pulse signal X_CNT_P is generated to increment the row address XA by '1'. The row decoder 110 selects the next row/word line in response to the incremented row address XA. After that, memory cells coupled to the selected row are 3post-programmed in the unit of ×8 by the same manner described above, so it will not be further described If the incremented row address XA matches with a row address (for example, a row address of the 384'th word line) stored in the register 131 of the row address generator 130, the row address generator 130 outputs the flag information G4816 informing that the columns are selected in the unit or set of ×16.

As the flag information F4816 indicates that columns are selected in the unit of ×16, the 2-bit counter 152 generates a carry every transition of the program execution signal PGM_EXE. The 2-bit counter 152 increments the higher bit by '1' in response to transition of the program execution signal PGM_EXE. The selection circuit 170 activates the selection signals G0_SEL~G3_GEL at the same time. This means that all of the selected bit lines are driven with the bit line voltage $V_{BL}$ at the same time. After post-programming the memory cells coupled to the bit lines driven with the bit line voltage $V_{BL}$, the control logic block 160 activates the program execution signal PGM_EXE. Thereafter, the column address YA is incremented by the same manner with the aforementioned and memory cells coupled to selected bit lines (that is, 16 bit lines) are post-programmed at a time. Post-programming operations for memory cells coupled to the rest of the rows are carried out in the same manner described above, so they will not be further described.

As described above, with an increase in the number of selected rows, the number of write drivers selected at the same time increases and hence increases the number of memory cells to be simultaneously post-programmed. Thus, the extension in the number of the write drivers selected at the same time contributes to shortening the time required for conducting the post-programming operation in the flash memory device.

The above-disclosed exemplary embodiments are to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of post-programming a flash memory device, comprising the steps of:
   (a) post-programming memory cells of a selected word line from a plurality of word lines in a predetermined unit;
   (b) determining, after incrementing an address for selecting the next word line, whether the incremented address matches one of a plurality of reference addresses; and
   (c) varying the post-programming unit of the memory cells whenever the incremented address matches one of the plurality of reference addresses.

2. The method as set forth in claim 1, wherein the post-programming unit of the selected memory cells is incremented whenever the incremented address matches one of the plurality of reference addresses.

3. The method as set forth in claim 1, wherein the post-programming unit of the selected memory cells is changed by controlling a number of write drivers activated at a same time.

4. The method as set forth in claim 1, wherein the steps of (a) through (c) are repeated until all word lines are selected.

5. The method as set forth in claim 1, wherein the plurality of reference addresses are stored in a register of the flash memory device.

6. The method as set forth in claim 5, wherein the plurality of reference addresses are externally provided to the register before a normal operation.

7. The method as set forth in claim 5, wherein the plurality of reference addresses are provided to the register from an array of the flash memory device before a normal operation.

8. A method of post-programming a flash memory device, comprising the steps of:
   (a) selecting a word line from a plurality of word lines in response to an address;
   (b) post-programming memory cells of the selected word line in a predetermined post-programming unit;
   (c) determining, after incrementing the address, whether the incremented address matches one of a plurality of reference addresses;
   (d) varying the post-programming unit of the selected memory cells whenever the incremented address matches one of the plurality of reference addresses; and
   (e) repeating the steps (a) through (d) until all word lines are selected.

9. The method as set forth in claim 8, wherein the post-programming unit of the selected memory cells is incremented whenever the incremented address matches one of the plurality of reference addresses.

10. The method as set forth in claim 8, wherein the post-programming unit of the selected memory cells is changed by controlling a number of write drivers activated at a same time.

11. A flash memory device having a memory cell array with memory cells arranged in rows and columns, comprising:
    a row decoder selecting the rows in response to a row address;
    a column decoder selecting the columns in response to a column address;
    write drivers divided into a plurality of groups for driving the selected columns with a bit line voltage;
    a column address generator counting a number of post-programming operations and generating the column address and a count-up pulse signal;
    a row address generator configured to store a plurality of reference addresses, generating the row address in response to the count-up pulse signal; and
    a selection circuit generating selection signals to activate each of the write driver groups in response to a counted value of the count-up pulse signal,
    wherein the row address generator outputs flag information indicating a change of column selection unit whenever the row address matches one of the plurality of reference addresses, and
    wherein the selection circuit controls activation of the selection signals in accordance with the flag information so as to increase a number of the memory cells to be post-programmed in the selected columns.

12. The flash memory device as set forth in claim 11, wherein the column address generator outputs the count-up pulse signal when memory cells of the selected row are all post-programmed.

13. The flash memory device as set forth in claim 11, wherein the write drivers of each of the plurality of groups, when a corresponding selection signal is activated, are set in a program value to drive corresponding bit lines with a bit line voltage.

14. The flash memory device as set forth in claim 11, wherein the row address generator comprises a register for storing the plurality of reference addresses.

15. The flash memory device as set forth in claim 14, wherein the plurality of reference addresses are externally provided to the register before a normal operation.

16. The flash memory device as set forth in claim 14, wherein the plurality of reference addresses are provided to the register from the memory cell array before a normal operation or at a power-up time.

17. The flash memory device as set forth in claim 11, wherein the flag information informs that the columns are selected in the column selection unit selected from ×4, ×8, and ×16.

18. The flash memory device as set forth in claim 17, wherein when the flag information informs that the columns are selected in the unit of ×4, the selection circuit activates the selection signals in sequence in response to the counted value.

19. The flash memory device as set forth in claim 17, wherein when the flag information informs that the columns are selected in the unit of ×8, the selection circuit activates pairs of the selection signals in sequence in response to the counted value.

20. The flash memory device as set forth in claim 17, wherein when the flag information informs that the columns are selected in the unit, of ×16, the selection circuit activates the selection signals at the same time in response to the counted value.

21. The flash memory device as set forth in claim 11, wherein the column address generator comprises:
    a 2-bit counter conducting a counting operation in accordance with a transition of a program execution signal instructing the post-programming operation and outputting a pulse signal whenever a carry is generated; and
    an N-bit counter generating the column address from a counting operation in accordance with the pulse signal and generating the count-up pulse signal when the columns are all selected.

22. The flash memory device as set forth in claim 21, wherein the 2-bit counter is configured to vary a point of generating the carry in accordance with the flag information.

23. The flash memory device as set forth in claim 11, wherein the post-programming operation includes a verifying operation.

24. The flash memory device as set forth in claim 11, wherein the post-programming operation is carried out without including a verifying operation.

* * * * *